July 3, 1962 R. L. WATTERS 3,042,874

SEMICONDUCTOR BALANCING UNIT

Filed May 2, 1960

Inventor:
Robert L. Watters,
by John F. Ahern
His Attorney.

3,042,874
SEMICONDUCTOR BALANCING UNIT
Robert L. Watters, Schenectady, N.Y., assignor to General Electric Company, a corporation of New York
Filed May 2, 1960, Ser. No. 26,361
6 Claims. (Cl. 330—14)

This invention relates to balancing units and in particular to such balancing units utilizing semiconductor devices.

In many electrical systems it is often necessary to convert between a balanced system, which is symmetrical with respect to ground, and an unbalanced system in which one side is grounded. In addition, in order to be compatible with the system it is to convert, the balancing unit utilized must be capable of operating over a very large frequency range. Some of the most widely used units in the prior art have been transformers and coaxial lines. All such prior art units, however, are capable of operation over only a limited bandwidth. For this reason it has not been possible to provide a continuous conversion between a balanced system and an unbalanced system over a wide bandwidth. For example, for operation over extremely wide frequency ranges either different balancing units must be employed covering different frequency ranges or the balancing unit must be repeatedly readjusted to provide the desired wideband operation.

It is an object of this invention, therefore, to provide a new and improved balancing unit which avoids one or more of the disadvantages of the prior art.

It is another object of this invention to provide a new and improved balancing unit capable of operation over a wider bandwidth than any prior art unit.

It is another object of this invention to provide a balancing unit which provides conversion between a balanced and unbalanced system over an extremely wide bandwidth continuously and without adjustment.

It is another object of this invention to provide a simple and inexpensive balancing and impedance matching unit for continuous operation over extremely wide bandwidths.

It is still another object of this invention to provide a balancing unit which is capable of continuous operation from direct current (zero cycles) to an extremely high upper frequency.

Briefly stated, in accordance with one aspect of this invention, a balancing unit for continuously converting between a balanced system and an unbalanced system, comprises a narrow junction degenerate semiconductor diode, biased for operation in its region of negative resistance, and a resistance, having a value approximately one half the absolute value of the diode negative resistance, in series with the diode. By an appropriate selection of the resistances, impedance matching in addition to conversion between the two systems, may be achieved if desired.

The features of my invention which I believe to be novel are set forth with particularity in the appended claims. My invention itself, however, both as to its organization and method of operation, together with further objects and advantages thereof, may best be understood by reference to the following description taken in connection with the accompanying drawing in which:

The semiconductor device used in the practice of this invention is a narrow junction degenerate semiconductor diode or so-called "tunnel diode." Such diodes are semiconductor devices including a single P-N junction and exhibiting a region of negative resistance in the low forward voltage range of their current-voltage characteristics.

Such devices are fabricated so as to provide regions of P and N-type conductivity having a very narrow junction therebetween, both of the regions being "degenerate." The use of the term "degenerate" refers to a body or region of semiconductive material which, if N-type, contains a sufficient concentration of excess donor impurity to raise the "Fermi-level" thereof to a value of energy higher than the minimum energy of the conduction band on the energy band diagram of the semiconductive material. In a P-type semiconductive body or region, degeneracy means that a sufficient concentration of excess acceptor impurities are present therein to depress the "Fermi-level" to an energy lower than the maximum energy of the valence band on the energy band diagram for the semiconductive material. The "Fermi-level" in such an energy band diagram is the energy level at which the probability of there being an electron present in any particular state is equal to one half.

The forward voltage range of the current-voltage characteristic of such a device at which the negative resistance region appears varies depending upon the semiconductive material from which the device is fabricated. For example, the range of the negative resistance region for a germanium device is from about 0.04 to 0.3 volts while for gallium arsenide the range is from about 0.12 to 0.5 volts. It appears that the negative resistance of such a device is independent of frequency from zero cycles (direct current) to well into the microwave frequency range.

For further details concerning the narrow junction degenerate semiconductor device utilized in the practice of this invention, reference may be had to the copending application of Jerome J. Tiemann, Serial No. 858,995, filed December 11, 1959, now abandoned, which is assigned to the assignee of the present invention and incorporated herein by reference.

Figure 1:
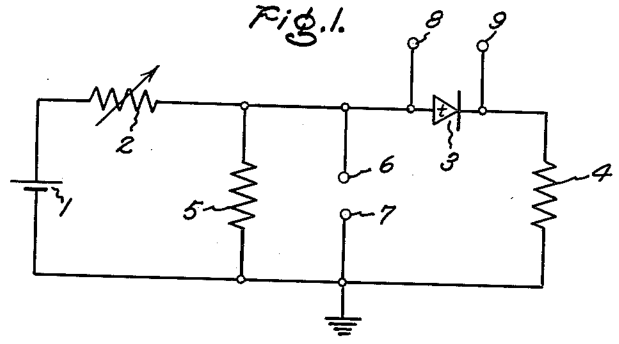
FIG. 1 is a schematic circuit diagram of one embodiment of this invention.

In FIG. 1 there is shown a voltage source 1, resistance 2, narrow junction degenerate semiconductor diode 3 and resistance 4 all connected in series. Resistance 5 is connected from one end of resistance 2 to the other side of the voltage source. Voltage source 1 and series-parallel resistances 2 and 5 provide a convenient bias means for diode 3.

While the balancing unit arrangement of this invention is capable of converting equally between balanced and unbalanced systems, for simplicity of description, the operation thereof will be described in detail only with respect to the conversion from an unbalanced system, in which one side is grounded, to a balanced system which is symmetrical with respect to ground.

Figure 2:
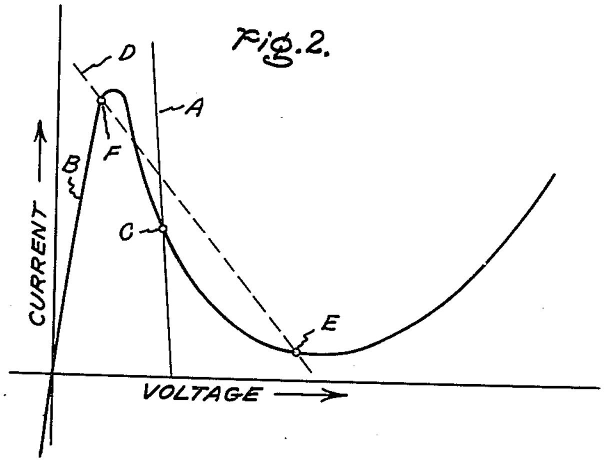
FIG. 2 is a current-voltage characteristic of a typical narrow junction degenerate semiconductor diode suitable for use in the practice of this invention illustrating suitable direct current load lines.

Since the intersection of the direct current load line with the diode current-voltage characteristic determines the operating point for this circuit, the values of voltage source 1 and resistances 2 and 5 are so selected that a direct current load line is established which intersects the diode current-voltage characteristic in the negative resistance region thereof. When diode 3 is so biased in its negative resistance region, it presents a negative resistance to the circuit, the magnitude of which is determined by the slope of the negative resistance region at the particular operating point selected. For example, the load line A intersecting the diode current-voltage characteristic B at point C, as shown in FIG. 2, illustrates an appropriate load line to assure diode 3 appearing as a negative resistance and at the same time assures that the diode does not switch. For example, since there is only one intersection of the load line with the diode characteristic there is only one operating condition for the diode. For small signal levels a load line such as shown at D with an operating point E in the negative resistance region may be utilized in appropriate applications. Since with such a load line there are two operating points E and F, a large signal could cause diode 3 to switch to the other operating point F where it no longer appears as a negative resistance and the desired balancing operation would no longer be possible. It is preferred, therefore, for more reliable operation with varying signal level, that a direct current load line be provided which intersects the diode current-voltage characteristic at only one point.

To provide a direct current load line which intersects the diode current-voltage characteristic at only one point, the equivalent direct current resistance shunting diode 3 should be less than the absolute value of the diode negative resistance. In this way the load line has a steeper slope than that of the negative resistance region of the diode characteristic at the selected operating point and the intersection with the characteristic must always be at only one point.

In operation, the signal from the system to be converted must not be so large as to change the value of the diode negative resistance. This can be assured by providing an operating point at a linear portion of the negative resistance region and applying a signal which does not cause the operating point to be moved substantially out of this range. To allow for input signals of maximum amplitude, therefore, it is preferred to provide an operating point near the center of the most linear portion of the diode negative resistance region. This allows larger signals to be applied without substantially altering the diode negative resistance. It is apparent, however, that for smaller input signals a smaller linear portion of the negative resistance region may be tolerated, the requirement being that the input signal not substantially alter the diode negative resistance.

The range of linearity of the negative resistance region may be increased, if desired in appropriate applications, by a parallel combination of two suitable narrow junction degenerate semiconductor diodes to provide an equivalent current-voltage characteristic with a greater linear negative resistance region.

For converting from an unbalanced system to a balanced system, therefore, the signal from the unbalanced system is applied to the balancing unit at terminals 6—7. This impresses the signal between one side of diode 3 and ground. An output may be taken across diode 3, at terminals 8—9, which is symmetrical with respect to ground. This may be shown by the following relationship for determining the signal voltage across the resistance 4:

$$e_2=e_1\left(\frac{R_4}{R_4+(-R_3)}\right)$$

where $e_1$=signal applied at terminals 6—7
$e_2$=signal voltage appearing across resistance 4
$R_3$=diode resistance
$R_4$=resistance 4.

For circuit arrangement of this invention, to provide a balanced output at terminals 8—9, resistance 4 is made equal to one half the diode negative resistance. The voltage across resistance 4 is then:

$$e_2=e_1\left(\frac{\frac{R_3}{2}}{\frac{R_3}{2}+(-R_3)}\right)=-e_1$$

Since the signal applied to terminals 6—7 from the system to be converted is of a magnitude such that diode 3 at all times appears as a negative resistance of predetermined value, the signal voltage $e_2$ appearing across resistance 4 is equal in magnitude to the input signal $e_1$, but of opposite phase. That is, $e_2=-e_1$. There is an increase in signal voltage at terminal 8, as a result of the input from the unbalanced system, and a decrease in voltage at terminal 9. The output at terminals 8—9, therefore, is symmetrical with respect to ground and the balancing unit provides conversion from an unbalanced system to a balanced system. It is readily apparent, since narrow junction degenerate semiconductor diode 3 is a bi-lateral element, that the conversion from a balanced to an unbalanced system may be made by interchanging the input and output.

Since the negative resistance of the narrow junction degenerate semiconductor diode used in the practice of this invention is independent of frequency well into the microwave frequency range, the balancing unit of this invention is not frequency dependent and is, therefore, capable of providing continuous conversion between balanced and unbalanced systems over extremely wide bandwidths.

Often, in addition to providing cconversion between balanced and unbalanced systems, it is desirable to match the impedances of the two systems. For such operation, however, there must be an appropriate selection of resistances 4 and 5 and the diode negative resistance, with respect to the impedances of the systems to be matched.

Figure 3:
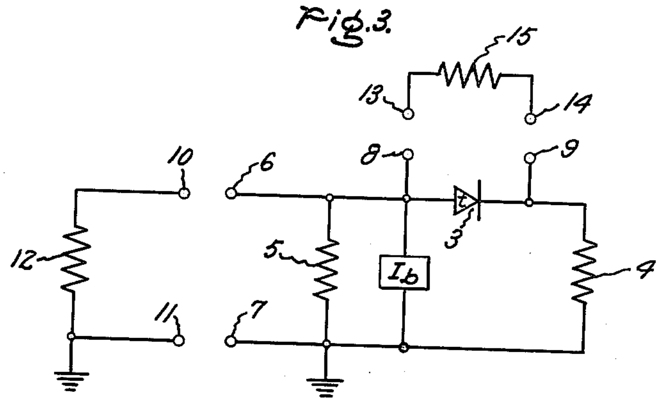
FIG. 3 is a schematic circuit diagram of another embodiment of this invention.

This mode of operation may best be understood by reference to FIG. 3. In FIG. 3 there is shown the balancing unit of this invention including diode 3 and resistances 4 and 5. The terminals 10—11 of an unbalanced system having an impedance 12 are shown for connection to terminals 6—7 of the balancing unit. The terminals 13—14 of the balanced system, having an impedance 15, are shown for connection to the terminals 8—9 of the balancing unit. For simplicity the bias means for establishing the diode operating point is shown as a constant current generator $I_B$.

For matched operation, the impedance looking into the terminals 6—7 with the balanced system connected to terminals 8—9 must be equal to the impedance 12 of the unbalanced system. In like manner the impedance looking into the terminls 8—9 with the unbalanced system connected to terminals 6—7 must be equal to the impedance 15 of the balanced system.

For any case wherein it is desired to match impedances in addition to providing conversion between the two systems, the values of the impedances 12 and 15 will be known. In addition, as described in detail hereinbefore, for balanced operation only resistance 4 must be one half the absolute value of the diode negative resistance.

With the balanced system connected to terminals 8—9 of the balancing unit the impedance 15 is in parallel circuit relationship with the diode negative resistance. For this reason resistance 4 must be selected equal to one half the absolute value of this parallel combination rather than one half the absolute value of the diode negative resistance since the impedance 15 of the system connected to terminals 8—9 must be considered.

Since the impedances of the two systems are known, expressing the values of the diode negative resistance and resistance 5 in terms of these known values provides a complete determination of all the circuit parameters for this mode of operation. The absolute value of the diode negative resistance designated herein as $R_3$, is given by the relationship:

$$R_3=R_{15}\left(\frac{4R_{12}-R_{15}}{4R_{12}-3R_{15}}\right) \qquad (1)$$

The value of resistance 5 with respect to the known resistances 12 and 15 of the systems to be matched is given by the relationship:

$$R_5=\frac{R_{12}(R_{15}-4R_{12})}{R_{15}} \qquad (2)$$

In addition, as stated above, for balancing, resistance 4 must be equal to one half the absolute value of the parallel combination of the diode negative resistance and the impedance 15 of the system connected to terminals 8—9. This may be given by the relationship:

$$R_4=\left|1/2\left(\frac{R_{15}(-R_3)}{R_{15}-R_3}\right)\right| \qquad (3)$$

As a practical matter it is desirable that resistance 5 be a positive resistance greater than zero. This means that:

$$R_{15}-4R_{12}>0$$

where $R_{12}$ and $R_{15}$ are the impedances of the unbalanced and the balanced systems respectively.

The ratio of the impedances, therefore, should be greater than 4 to 1. For example, the impedance of the system connected to terminals 8—9 should be greater than 4 times the impedance of the system connected to the terminals 6—7. As used herein and in the claims the term "impedance ratio" refers to the above relation.

The bandwidth over which a balancing unit will function is often given as a ratio of frequencies. For example, certain specially constructed prior art balancing units utilizing co-axial lines have been capable of operation over frequency bandwidths as great as 100 to 1. Since the balancing unit arrangement of this invention is capable of operation from zero cycles to an extremely high upper frequency limit a frequency ratio cannot be utilized as a significant figure of merit since this would indicate an infinitely large bandwidth. It is readily apparent, however, that the balancing unit of this invention is capable of operation over an extremely wide bandwidth and one which is many times wider than any known prior art arrangement.

One balancing unit constructed in accordance with this invention to provide continuous conversion between balanced and unbalanced systems over extremely wide bandwidths utilized the following parameters, which are given by way of example only:

| | |
|---|---|
| Voltage source **1** | 1.5 volts. |
| Resistance **2** | 5000 ohms (variable). |
| Diode **3** | General Electric gallium-arsenide narrow junction degenerate semiconductor diode having a peak current of 0.5 milliampere and a minimum absolute value of negative resistance of approximately 440 ohms. |
| Resistance **4** | 220 ohms (½ absolute value of negative resistance of diode **3**). |
| Resistance **5** | 100 ohms. |

In addition, for this particular circuit arrangement utilizing a bias means including voltage source 1 and series-parallel resistances 2 and 5, the equivalent resistance in parallel with diode 3 due to the combination of resistances 2, 4 and 5 was made less than the absolute value of the diode negative resistance to prevent any possibility of switching and allow for maximum signal. Usually resistance 2 is large compared to resistance 5 so for practical purposes this may be provided by assuring that the series combination of resistances 4 and 5 is less than the absolute value of the diode negative resistance.

For a typical case, wherein it is required to provide conversion and impedance matching from an unbalanced line having a characteristic impedance of 50 ohms to a balanced line having a characteristic impedance of 300 ohms, the circuit parameters may be calculated from Equations 1, 2 and 3 as follows:

| | |
|---|---|
| Resistance 3 | $\frac{300}{7}$ ohms. |
| Resistance 4 | 25 ohms. |
| Resistance 5 | $\frac{100}{6}$ ohms. |
| Resistance 12 | 50 ohms. |
| Resistance 15 | 300 ohms. |

If balancing is not required, an effective impedance matching network may be provided by making one side of the input and one side of the output common. For example, in FIG. 3 the ground may be shifted from terminal 7 to terminal 6 to conveniently achieve this result. In addition, for impedance matching only, resistance 4 is no longer required to have a value substantially equal to the absolute value of the parallel combination of the impedance of the line connected to terminals 8—9 and the diode negative resistance since this requirement was for the purpose of assuring conversion between balanced and unbalanced systems.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent of the United States is:

1. A balancing unit comprising: a narrow junction degenerate semiconductor diode device exhibiting a negative resistance region in the low forward voltage range of its current-voltage characteristic; bias means coupled to said diode device establishing a direct current load line which intersects said characteristic in said negative resistance region; and a resistance in series circuit with said diode, said resistance having a value substantially equal to one half the absolute value of the diode negative resistance.

2. A balancing unit comprising: a narrow junction degenerate semiconductor diode device exhibiting a negative resistance region in the low forward voltage range of its current-voltage characteristic; bias means coupled to said diode device establishing a direct current load line which intersects said characteristic only near the center of the most linear portion of the diode negative resistance region; and a resistance in series circuit with said diode, said resistance having a value substantially equal to one half the absolute value of the diode negative resistance.

3. A balancing unit comprising: a narrow junction degenerate semiconductor diode device exhibiting a negative resistance region in the low forward voltage range of its current-voltage characteristic; bias means coupled to said diode device establishing a direct current load line which intersects said characteristic in the negative resistance region maintaining said diode as a negative resistance of predetermined magnitude; and a resistance in series circuit with said diode, said resistance having a value substantially equal to one half the absolute value of said diode negative resistance.

4. A balancing unit for providing continuous conversion between balanced and unbalanced systems comprising: a narrow junction degenerate semiconductor diode device having at least two terminals and exhibiting a negative resistance region in the low forward voltage range of its current-voltage characteristic; bias means coupled to said diode device establishing a direct current load line which intersects said diode current-voltage characteristic in the negative resistance region to provide an operating point therein; a resistance in series with said diode device from one of said diode terminals to ground, said resistance having a value one half the absolute value of the diode negative resistance at said operating point; means for applying a signal from an unbalanced system between the other of said diode terminals and ground; and means for taking a balanced output across said diode terminals.

5. A balancing unit for providing continuous conversion between balanced and unbalanced systems comprising: a narrow junction degenerate semiconductor diode device having at least two terminals and exhibiting a negative resistance region in the low forward voltage range of its current-voltage characteristic; bias means coupled to said diode device establishing a direct current load line which intersects said diode current-voltage characteristic only in the negative resistance region to provide an operating point therein; a resistance in series with said diode device from one of said diode terminals to ground, said resistance having a value one half the absolute value of the diode negative resistance at said operating point; means for applying a signal from an unbalanced system between the other of said diode terminals and ground, said signal having a value less than that required to substantially change the absolute value of the diode negative resistance; and means for taking a balanced output across said diode terminals.

6. In a circuit for converting between balanced and unbalanced systems and simultaneously matching a first characteristic impedance $R_1$ associated with said unbalanced system to a second characteristic impedance $R_2$ associated with said balanced system, the combination comprising: a narrow junction degenerate semiconductor diode exhibiting a region of negative resistance in the low forward voltage range of its current-voltage characteristic; means for connecting said first characteristic impedance associated with said unbalanced system between one side of said diode and ground; means for connecting said second characteristic impedance associated with said balanced system across said diode; bias means coupled to said diode device establishing an operating point therefor in said region of negative resistance to provide a substantially constant negative resistance $R_3$, the absolute value of said negative resistance with respect to said first and second characteristic impedances being approximately defined by the relationship $$R_3 \cong \left| R_2\left(\frac{4R_1-R_2}{4R_1-3R_2}\right) \right|$$

a first resistance in series circuit with said diode device between said one side of said diode and ground, said first resistance having a value with respect to said first and second characteristic impedances approximately defined by the relationship $$R_1\left(\frac{R_2-4R_1}{R_2}\right)$$

and a second resistance in series circuit with said diode device connected between the other terminal of said diode and ground, said resistance having a value substantially equal to one half the absolute value of the parallel combination of said negative resistance and said second characteristic impedance.

References Cited in the file of this patent

Chang: "Low-Noise Tunnel-Diode Amplifier," Proc. IRE July 1959, pages 1268, 1269.